United States Patent [19]

Mitchell

[11] 4,379,305
[45] Apr. 5, 1983

[54] MESH GATE V-MOS POWER FET

[75] Inventor: Muni M. Mitchell, Huntington Station, N.Y.

[73] Assignee: General Instrument Corp., Clifton, N.J.

[21] Appl. No.: 154,280

[22] Filed: May 29, 1980

[51] Int. Cl.³ .............................................. H01L 29/06
[52] U.S. Cl. ........................................ 357/23; 357/55
[58] Field of Search ............. 357/55, 23, 23 VT, 23 R

[56] References Cited

U.S. PATENT DOCUMENTS

| | | | |
|---|---|---|---|
| 4,145,703 | 3/1979 | Blanchard et al. | 357/55 |
| 4,148,047 | 4/1979 | Hendrickson | 357/23 |
| 4,233,617 | 11/1980 | Klaassen et al. | 357/55 |
| 4,268,537 | 5/1981 | Goodman | 357/55 |

*Primary Examiner*—R. A. Rosenberger
*Attorney, Agent, or Firm*—Roland Plottel

[57] ABSTRACT

A power, V-grooved MOSFET having V-grooves extending in two orthogonal dimensions, thereby forming a semi-continuous mesh grid configuration which maximizes the periphery of the MOSFET channels for a given area of silicon, thus providing higher output current and lower "on resistance" for a given area than a conventional, interdigitated V-MOS power transistor having V-grooves running in only one dimension.

16 Claims, 16 Drawing Figures

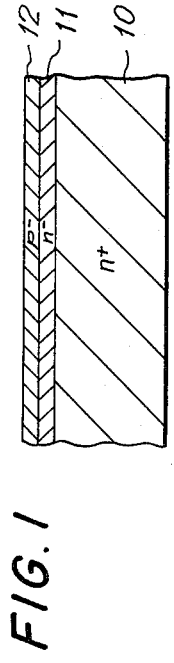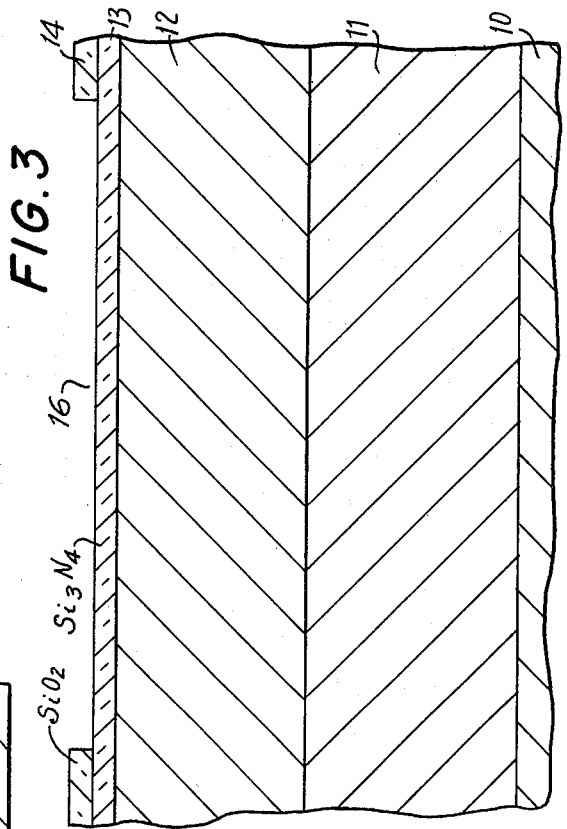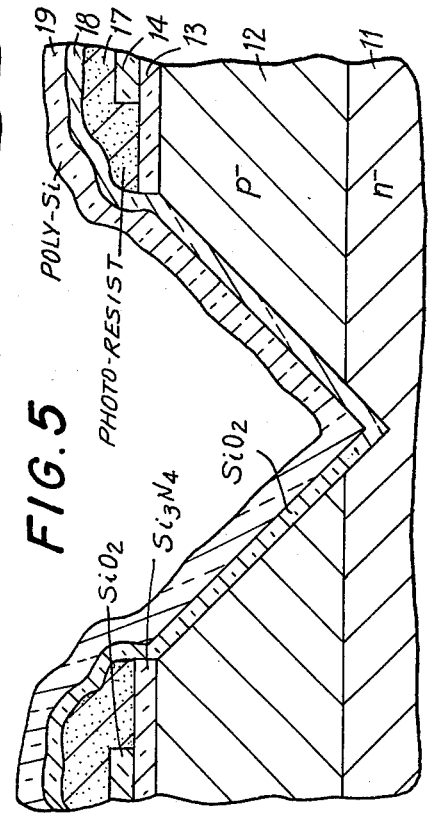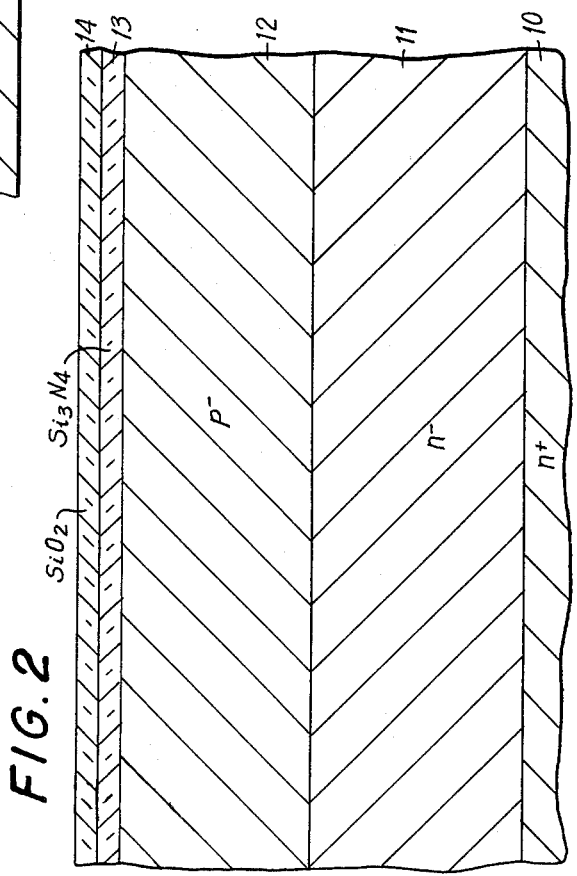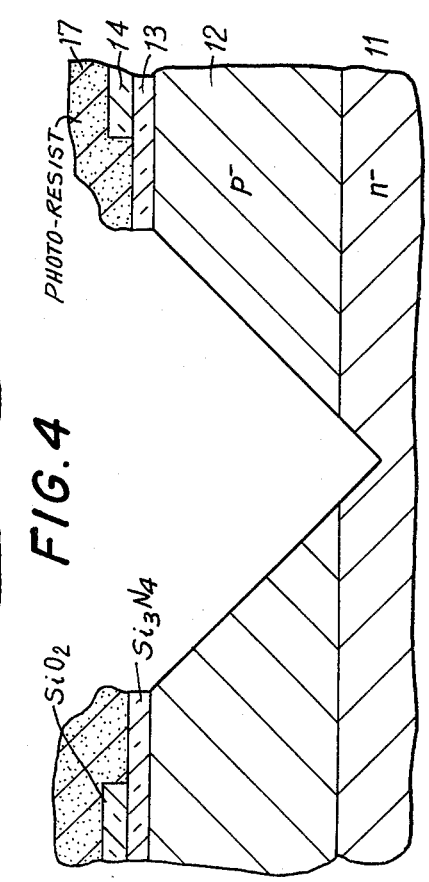

MESH GATE V-MOS POWER FET

TECHNICAL FIELD

Broadly speaking, this invention relates to semiconductor devices. More particularly, in a preferred embodiment, this invention relates to a V-groove, MOSFET, power, semi-conductor device and methods for manufacturing the same.

DISCUSSION OF THE PRIOR ART

Semi-conductor devices intended for high-power applications may be manufactured in any of several configurations including bipolar and MOSFET; however, MOSFET devices offer several advantages over bipolar devices. Among these are (1) a greater safe operating area which results from the fact that MOSFET devices have an inherent negative temperature co-efficient of current versus temperature; (2) MOSFET devices may be controlled by a low gate-drive current and may therefore be directly driven by the output of MOS LSI output stages; (3) MOSFET devices have an extremely fast turn-off since no minority carrier storage effects are present; and (4) MOSFET devices are free from secondary breakdown because no current hogging is present.

Of course, MOSFET devices themselves can be manufactured in a variety of configurations. However, recently considerable interest has been expressed in V-grooved MOSFET, sometimes referred to as V-MOS devices, which exhibit several advantages over MOSFET devices of conventional design. See, for example, the article entitled "A High Power Mosfet With Vertical Drain Electrode and Meshed Gate Structure" by Yoshida, Kubo and Ochi, *IEEE Journal of Solid State Circuits*, Volume SC-11, Number 4, August, 1976, and "V-MOS, A Breakthrough in Power MOSFET Technology" by Shaeffer, Siliconix, Inc., Application Note AN76-3, May, 1976.

Unfortunately, prior art V-grooved MOSFET devices, although representing a significant advance over conventional devices, have nevertheless not gained the acceptance that had been hoped. This is due, in part, to the higher cost of V-MOS which is caused, in turn, by the increased complexity of manufacture. Particularly troublesome are the large number of critical photomask operations that must be performed to manufacture a V-grooved MOSFET device.

The object of this invention, therefore, is to provide a V-groove MOSFET architecture that overcomes all of the deficiencies noted above with respect to conventional V-groove MOSFET devices.

SUMMARY OF THE INVENTION

In fulfillment of the above and other objectives, the instant invention comprises a V-MOS, field-effect, semiconductor device, having gate, source and drain electrodes. The device comprises a planar, doped silicon substrate; a first, doped, silicon layer epitaxially grown on the silicon substrate; a second, doped, silicon layer epitaxially grown on the first silicon layer; at least two, spaced-apart, parallel, first V-grooves extending partially thru the first and completely thru the second layers but not into the substrate; at least two, spaced-apart, parallel, second V-grooves extending through the first and second layers into the substrate, the first and second V-grooves having doped poly-silicon on the walls thereof, being orthogonally oriented with respect to one another and and defining by their intersection at least one generally rectangular, isolated, electrically floating region of the second doped layer which acts as the substrate electrode of the device, the remaining non-isolated regions of the second layer acting as the gate electrode of the device, the substrate acting as the drain electrode.

The invention and its mode of operation will be more fully understood from the following detailed description when taken with the appended drawings.

BRIEF DESCRIPTION OF THE DRAWINGS

FIG. 1 is a cross-sectional view of a silicon substrate for use with a device according to the invention;

FIG. 2 is a cross-sectional view of the substrate shown in FIG. 1 after additional processing steps have taken place thereon;

FIG. 3 is a cross-sectional view of the substrate shown in FIG. 2 after a first photo-lithographic processing step has been effected;

FIG. 4 is a cross-section of the substrate shown in FIG. 3 after a V-groove has been opened therein;

FIG. 5 is a cross-sectional view of the substrate shown in FIG. 4 after the V-groove has been coated with a layer of silicon dioxide and poly-silicon;

DETAILED DESCRIPTION OF INVENTION

Figure 6:
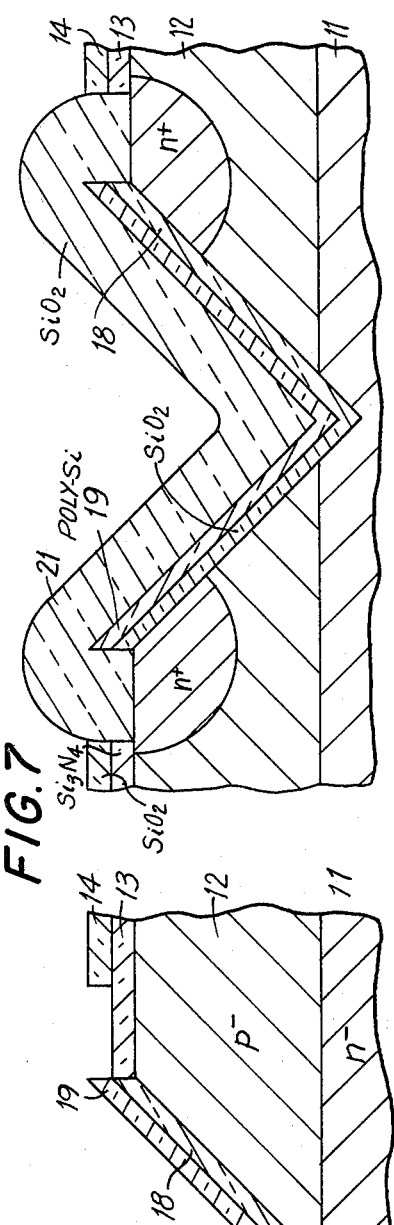
FIG. 6 is a cross-sectional view of the substrate shown in FIG. 5 after additional processing steps have been effected.

The first illustrative embodiment of the invention to be discussed comprises a V-grooved power MOSFET having V-grooves that extend in two orthogonal dimensions thereby to form a semi-continuous grid configuration. Such a configuration maximizes the periphery of the MOSFET channel for any given area of silicon and, therefore, yield higher output current and lower "on resistance" for a given area of silicon than a conventional, interdigitated V-MOS power transistor having V-grooves extending in only one dimension. As will be explained, a further advantage of this grid-like gate structure is that, although the contact to the polysilicon in the device is made in a bonding area positioned away from the active gate grooves, the series resistance $\gamma S$ of the gate is drastically reduced, due to the semi-continuous nature of its structure. This, in turn, will give an improved frequency response since the gate product, i.e., the product of $\gamma S$ times Cg, the gate capacitance, is correspondingly reduced.

As shown in FIG. 1, the first step in the manufacture of a device according to the invention is to grow a relatively lightly doped n− epitaxial silicon layer 11 upon a heavily doped n+ silicon substrate 10. A second epitaxial layer 12 of p-type material is then grown on top of the first epitaxial layer 11, as shown. The thickness and resistivity of the first layer 11 is, of course, dependent upon the breakdown voltage BVDSS of the device under fabrication. In like fashion, the thickness and resistivity of the second eiptaxial layer 12 depends upon the threshold voltage and punchthrough voltage from drain to source of the device being fabricated. The thickness of the second epitaxial layer is also determined by the surface V-groove gate openings with a minimum thickness equal to approximately $0.7 \times Xg$ (opening). For a device having a breakdown voltage of from 40 to 60 volts, say, epitaxial layer 11 will have a thickness of 4 microns and a resistivity of 0.8 ohm-centimeters. The thickness and resistivity of epitaxial layer 12 will be 3 microns and 0.3 to 0.5 ohm-centimeters, respectively. Obviously for higher breakdown voltages the resistivity of the n− eiptaxial layer 11 will increase. For example, for a 450 volt breakdown device, this layer would have a thickness in the order of 25 microns with a resistivity of 12.5 ohm-centimeters.

Where the circuit applications are such as to require reverse blocking in addition to the normal forward blocking obtained from any MOSFET device, a p+ substrate may be substituted for the n+ substrate 10 shown in FIG. 1. If this is done, and the same or similar double eiptaxial layers are grown on the substrate, the drain-to-source voltage can go negative (for an n channel structure) and the n− to p+ substrate junction will then block voltages up to the breakdown voltage of that junction. In this manner, a MOSFET device according to the invention will function similarly to a thyristor device.

In order to achieve maximum power density, the source and gate V-groove cells are advantageously positioned as close as possible to one another. This will have the additional advantage of producing the lowest possible cost per device since chip size is reduced for a given output current or "on resistance" level. In addition, it is well-known that device yield depends inversely upon the number of photo-lithographic steps required to produce a device. Hence, reducing the number of steps will, of necessity, increase yield and further reduce chip cost.

Turning now to FIG. 2, the manufacturer of a V-groove device according to the invention begins with an n+ or p+ silicon substrate 10 of 100 crystal orientation having a first epitaxially grown n− layer 11 and a second epitaxial p− layer 12 thereon. Next, a layer of silicon nitride 13 is deposited on the p− epitaxial layer 12 to a depth of approximately 2,000 Å units. Next, a layer of silicon dioxide 14 is deposited over the layer of silicon nitride using either a high or low temperature deposition process, again to a depth of approximately 2,000 Å. Next, as shown in FIG. 3, by the use of any of several known photolithographic techniques, the regions 16 which are to form the source and gate grooves are opened up, e.g., by etching a patterned photo-resist overlayed on the silicon dioxide layer 14. By the use of an appropriate etchant, for example, a standard buffered HF etch, the silicon dioxide only is etched away with the etching process terminating automatically when the etchant reaches the $Si_3N_4$ silicon nitride layer 13.

Next, as shown in FIG. 4, a second photo-lithographic process is used to open up the V-groove areas only. Incidentally, this is the only critical alignment step in the manufacture of this device. As shown in FIG. 4, a layer of photoresist 17 is overlaid on the patterned silicon dioxide mask 14 which, after exposure and development, is then etched by the use of any suitble etching process, such as a hot phosphoric acid etch or a plasma etch, to eat through silicon nitride layer 13 thereby forming the desired V-groove opening in the p− material 12, which groove extends at its lower end down into the n− material 11.

As shown in FIG. 5, without removing photoresist layer 17, the next step in the process is to deposit a layer 18 of silicon dioxide over the entire V-groove region using some suitable low temperature plasma deposition process. Advantageously, the plasma deposition process takes place at a temperature of approximately 25° C., although temperatures as high as 250° C. may be tolerated. The depth of the silicon dioxide layer is not critical but should be in the order of 1500 Å. Next, a layer 19 of pure poly-silicon is sputtered over the entire surface to a depth of 10,000 Å. Now, as is well-known, the deposited silicon and the sputtered poly-silicon will not adhere well to photoresist 17. Thus, as shown in FIG. 6, photoresist 17 can easily be stripped chemically, or by the use of some plasma etching process, which will lift off the $SiO_2$ and the poly-silicon everywhere except in the groove areas.

Figure 7:
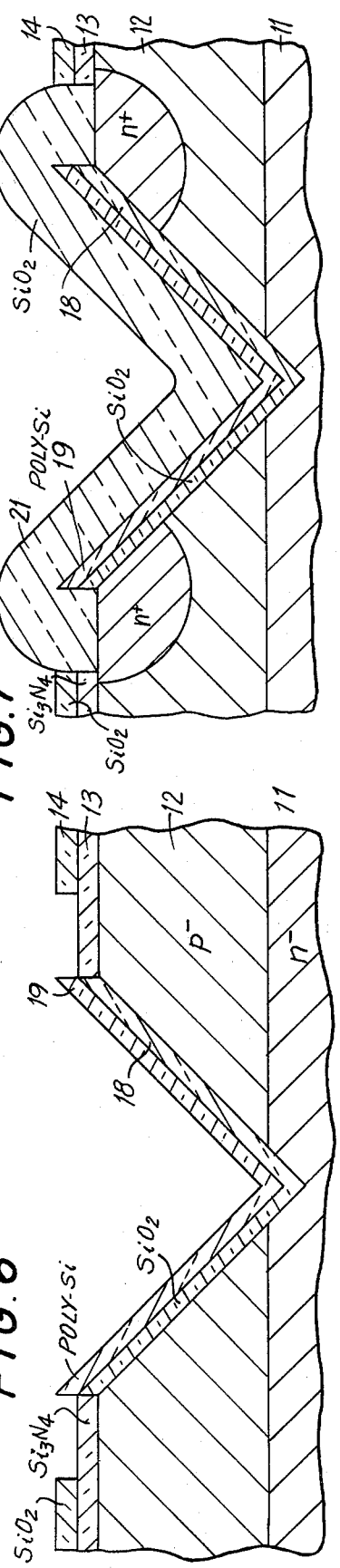
FIG. 7 is a cross-sectional view of the substrate shown in FIG. 6 after an additional layer of silicon dioxide has been grown over the V-grooves.

Next, the density of the deposited films is increased, for example, by exposing the films to elevated temperatures in the range of 900° C. to 1100° C. in a nitrogen atmosphere. Then, the entire wafer is etched, for example, by exposing the wafer to some suitable etch that is capable of dissolving silicon nitride, for example, a plasma etch or some suitable chemical etch, to expose the p− silicon region adjacent to the groove areas. These areas are identified by reference numeral 22 in FIG. 7. Next, the entire slice is exposed to an n+ dopant, such as phophorous or arsenic, e.g., by diffusion. The layers of $SiO_2$ and $Si_3N_4$ 14 and 13, respectively, will mask the diffusants from the p− layer 12 except, of course, in regions 22 adjacent to the groove areas which, thus, become doped to n+ material, as is the poly-silicon layer 19 in the groove. Next, the n+ diffusants are driven into the body of the semiconductor material in an oxidizing and/or steam ambient, which also functions to grow a thick (5,000 to 10,000 Å) $SiO_2$ region 21 on the poly-silicon gate as well as over the n+ source sites 22. The n+ sources are advantageously diffused to a depth of approximately 1 micron as well as laterally, as shown in FIG. 7.

Figure 8:
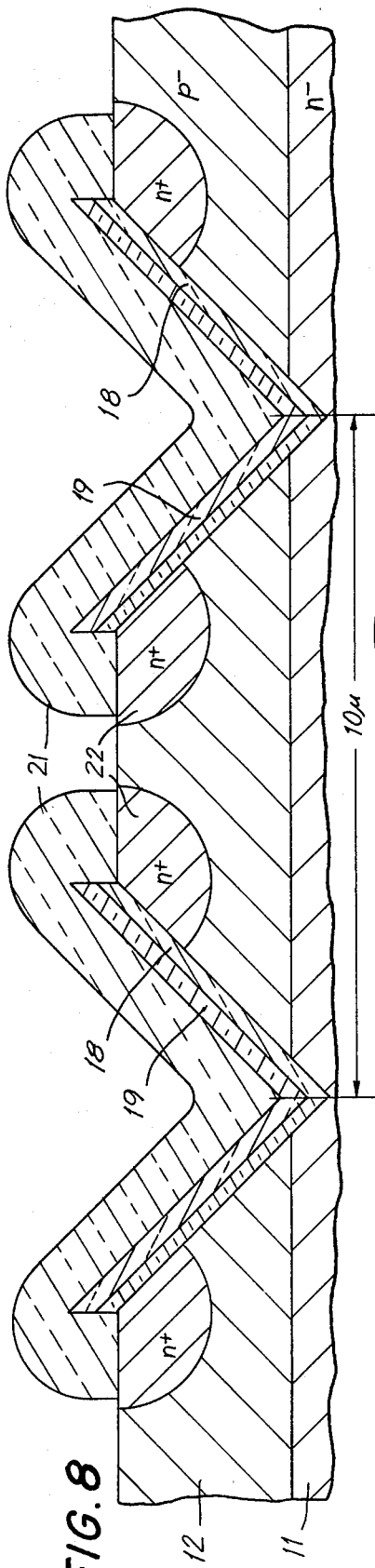
FIG. 8 is a cross-sectional view showing two adjacent V-grooves and a common substrate.

Next, the entire slice is etched in a suitable $SiO_2$ chemical etch, or by the use of a plasma etch, to remove the originally deposited $SiO_2$ layer 14 which, it will be recalled, is only approximately 2,000 Å thick. Thus, the 5,000 to 10,000 Å $SiO_2$ region 21 will not be substantially affected by this SiO$_2$ etch step. Following the SiO$_2$ etch, some suitable Si$_3$N$_4$ chemical etchant, or some suitable plasma etch source, is used to remove the original 2,000 Å deposited Si$_3$N$_4$ layer 13. The structure as it appears at this stage of the process is shown in FIG. 8.

Next, the poly-silicon material in the gate region is opened up using a third photo-lithographic step to establish the pad areas. This third photo-lithographic step is, again, non-critical and advantageously may be used to etch the SiO$_2$ remaining in the region where the pads will be formed.

Figure 9:
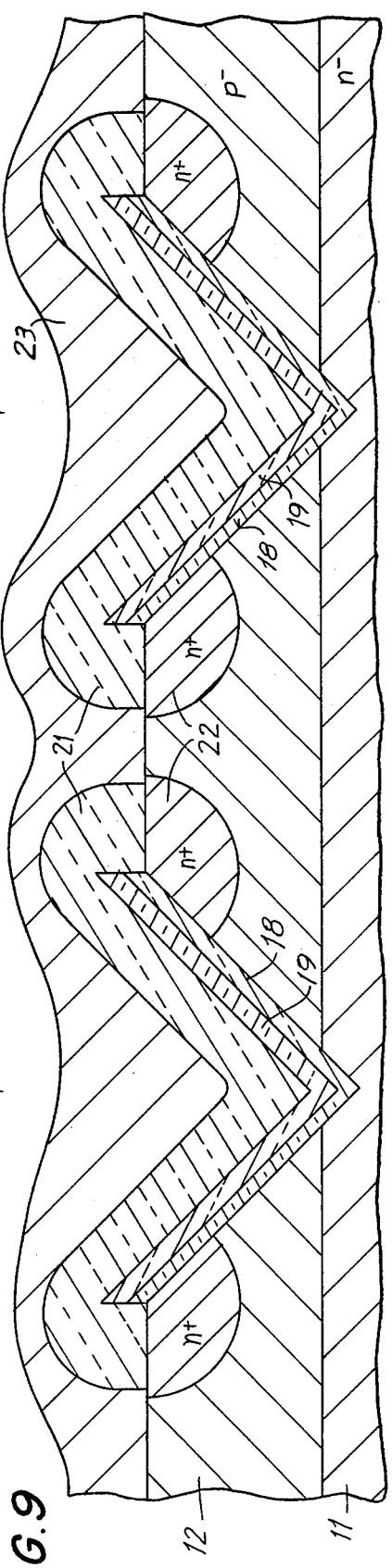
FIG. 9 is a cross-sectional view of the substrate shown in FIG. 8 after metalization has been grown over the entire upper surface of the device.
Figure 10:
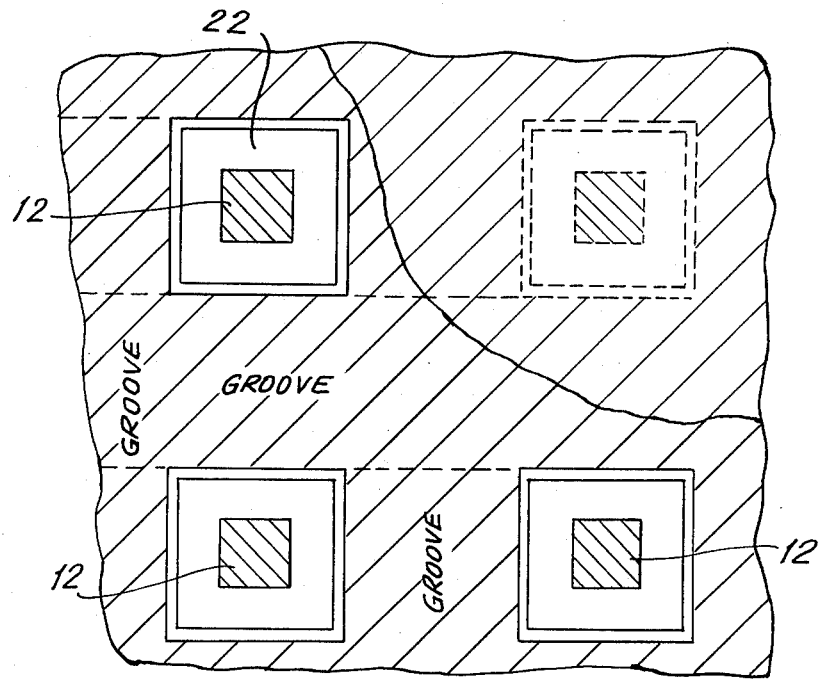
FIG. 10 is a planar view of a portion of a semiconductor wafer showing a plurality of devices according to the invention.

Then, as shown in FIG. 9, a layer of metalization 23 is evaporated or sputtered over the entire surface of the wafer, e.g., to a depth of 20,000 Å. While several metals may be used for this metalization layer, Aluminum is the preferred material. Finally, in the fourth photo-lithographic step, which is also non-critical, the metal is etched to separate the gate from the rest of the silicon surface, which of course comprises the source electrode. With the above described process, it is possible to achieve a center-to-center gate spacing of 10 microns or less. FIG. 10 is a view looking down on the top surface of the wafer and illustrates quite clearly that the V-grooves are etched in both the X and Y directions. In the drawing, reference numeral 31 represents the edge of the gate grooves, reference numeral 32 represents the the area in which the source electrode 23 contacts source region 22, as shown in FIG. 9, and rectangular areas 33 represent the contact of layer 23 to layer 12 for the devices. The grooves have legend 34.

The structure shown in FIG. 10 has, of course, the classic "Manhattan" geometry and this may pose a problem under some circumstances. The problem is that although the sidewalls along each of the four sides of each source area are the standard, expected 111 crystal planes upon which the V-MOS devices are formed, at each inside corner, where the grooves intersect, faster etching 112 and 331 crystal planes are exposed, resulting in undercutting. While this undercutting may be minimized by manipulating the various etching compositions, e.g., by adding small quantities of hydrazine to the etching solution, as well as by manipulating the etching temperature, or by the use of photomask compensation to assure that rectangular corners are formed, these additional steps complicate the manufacturing process and it would be clearly advantageous if these additional steps could be eliminated.

Figure 11:
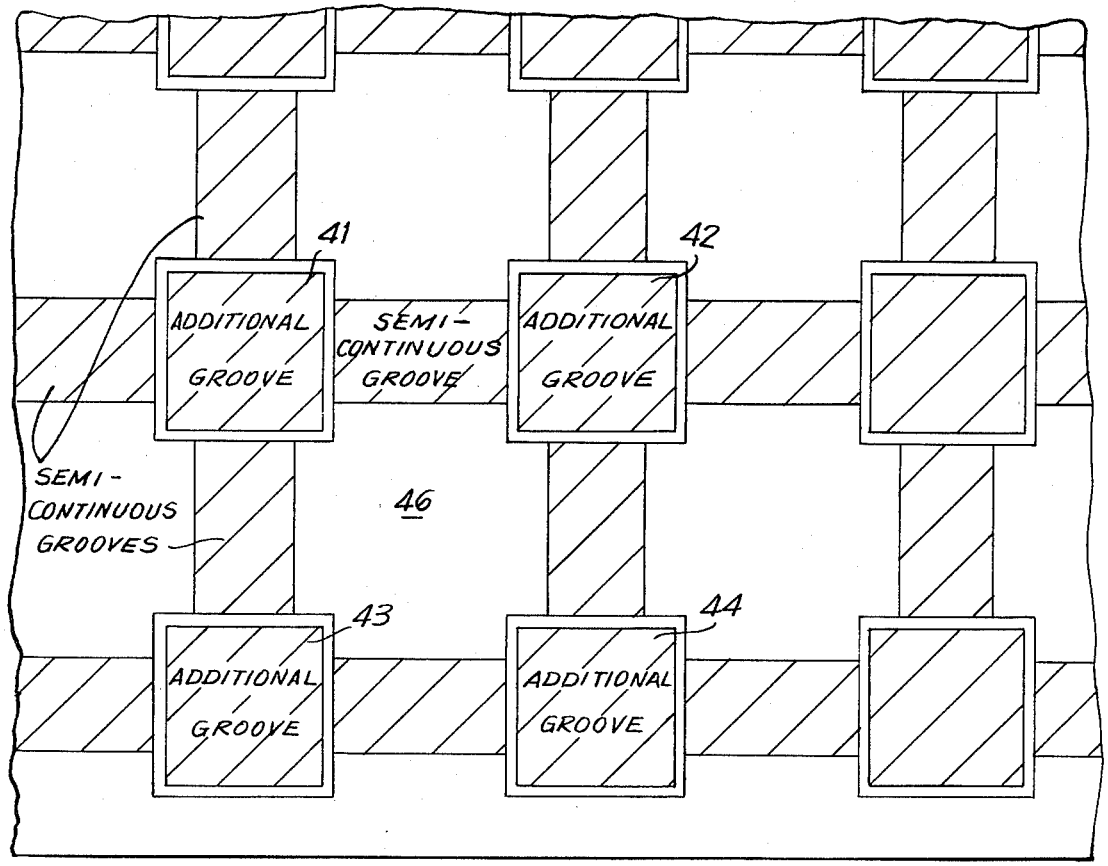
FIG. 11 is a plan view of an alternate embodiment of the invention in which additional source material is formed adjacent to each of the devices to reduce etching undercutting.

We have discovered that one way that this may be done is to modify the topological layout of the device, thereby eliminating corner undercutting entirely, as well as providing the additional advantage of increasing the active V-MOS groove periphery per unit area, thereby giving still further increased power and current density. The basis for this discovery is the realization that the area at the intersection of the V-grooves is "dead space" contributing nothing to the active gate periphery and therefore contributing nothing to the output current. According to the invention, the modified device incorporates at each intersection an additional source cell area that is either coincident at the corners with the existing cells or which slightly overlaps the existing cells at each corner. This arrangement is shown in FIG. 11 and it will be evident that with such an arrangement the etch will never "see" a convex corner; thus, corner undercutting is eliminated. If one compares the device shown in FIG. 11 with that shown in FIG. 10, it is possible to compare the active channel periphery for the repeat area of the original design, which employed 5 micron wide grooves and 5 micron × 5 micron source areas, which yields a linear gate periphery of 20 microns per 100 $\mu M^2$ area. The arrangement shown in FIG. 11, on the other hand, yields for the same layout rule a linear gate periphery of 32 microns with one micron corner overlap and 40 micron gate periphery for a coincident design. This represents a 60-100% improvement in power density over the arrangement shown in FIG. 10 while at the same time eliminating all the corner undercutting problems previously mentioned.

Turning to FIG. 11, the grooves surrounding the main source regions 46 are semicontinuous. Consider the four additional source regions 41, 42, 43, 44 at the intersection. In the modified device, the region at each intersection of the semicontinuous grooves is configured as an additional source region. A cell area may be defined by any area 10 by 10 microns, for example, an area running through the center line of the grooves.

As shown in FIG. 11, each additional source region is wider than the groove, i.e. 5 microns for the side of a region and 3 microns for the width of the groove. As shown in this Figure, the additional source region corners are 1 micron beyond the width. The main source regions 46, at their corners, are not square, but set back by 1 micron in each corner.

It will be seen that, as discussed, the additional source regions contribute to the output current, as desired. Also, since the additional source regions are in contact with the corners of the main source regions 46, the aforementioned undercutting will not take place, for the reasons previously discussed.

In the arrangement shown in FIG. 11, the gate periphery per cell repeat area is 32 $\mu M$ per 100 $\mu M^2$. This contrasts with the figure of 20 $\mu M$ per 100 $\mu M^2$ for the arrangement shown in FIG. 10, which represents a 60% increase in active current handling area. The arrangement shown in FIG. 11 assumes a typical 1 micron center region overlap of the original source sites.

We will now discuss an alternate embodiment of the invention which permits considerably fewer and far simpler processing steps, while at the same time keeping the number of photomasking operations to a minimum. The advantages of this alternate embodiment are (1) the source is self-registered to the gate (e.g., to the groove masks); (2) only four photomasks are required including (a) the gate (groove) photomask, (b) the source photomask, (c) the gate pad contact photomask and (d) the metalization photomask. Of these, only the source contact photomask requires any substantial degree of alignment tolerance; (3) the use of a shallow, n+ source diffusion with aluminum alloyed through the source to the body junction providing an excellent source to body short circuit, resulting in high drain-to-source sustaining voltages which approach the drain-to-body junction breakdown voltages.

Figure 12:
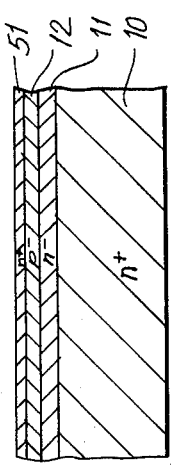
FIG. 12 is a cross-sectional view of a substrate used in manufacture of an alternative embodiment of the invention.

As shown in FIG. 12, the starting point for the alternate embodiment is the same as shown in FIG. 1 for the first embodiment; that is, an n+ doped silicon substrate 10 having double layer eiptaxial films 11 and 12 grown thereon. For the second embodiment of the invention, the p− layer 12 is approximately 2.75 microns thick and has a resistivity of 0.5 ohm-centimeters. As before, the thickness of the n− layer 11 is a function of the voltage that the device is to withstand. For example, for a 100 volt device, the n− layer 11 would typically be 1.6 ohm-centimeters in resistivity and approximately 10 microns thick. The substrate typically comprises an Sb-doped, 100 crystal orientation, silicon substrate having a resistivity of from 0.005 to 0.01 ohm-centimeters.

Figure 13:
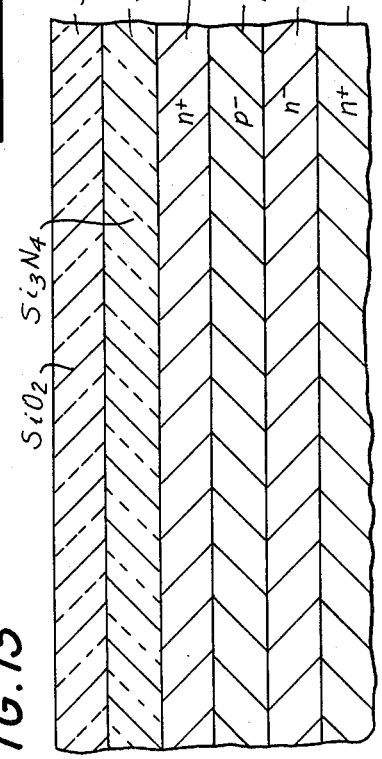
FIG. 13 is a cross-sectional view of the substrate shown in FIG. 12 after additional processing steps have been effected.

The first step in the manufacture of the alternate embodiment is to diffuse an n+ dopant over the entire top surface of the wafer, advantageously using a compound such as arsenic to achieve shallow X(j). This is depicted by layer 51 in FIG. 12. Next, as shown in FIG. 13, a layer of silicon nitride is deposited over the n+ layer 51 using either a high temperature deposition technique or a low temperature LPCVD process. The $Si_3N_4$ layer is represented by reference numeral 52 in FIG. 13. Next, a layer of $SiO_2$ is put down on top of the $Si_3N_4$ using any conventional deposition technique. This layer is designated as layer 53 in FIG. 13.

Figure 14:
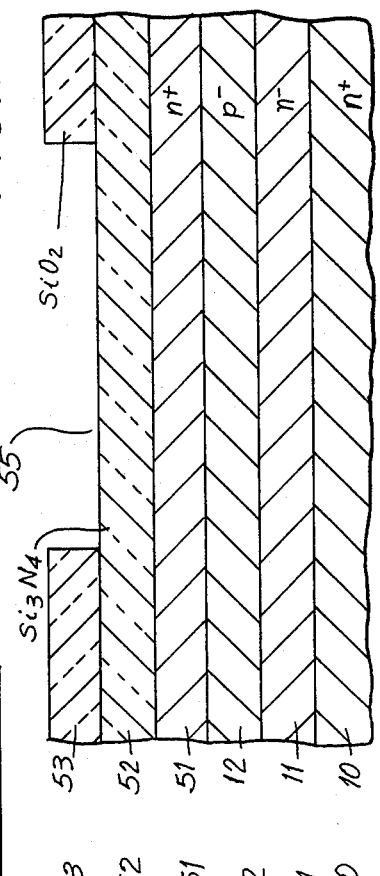
FIG. 14 is a cross-sectional view of the substrate shown in FIG. 13 after a first photo-lithographic processing step has taken place.
Figure 15:
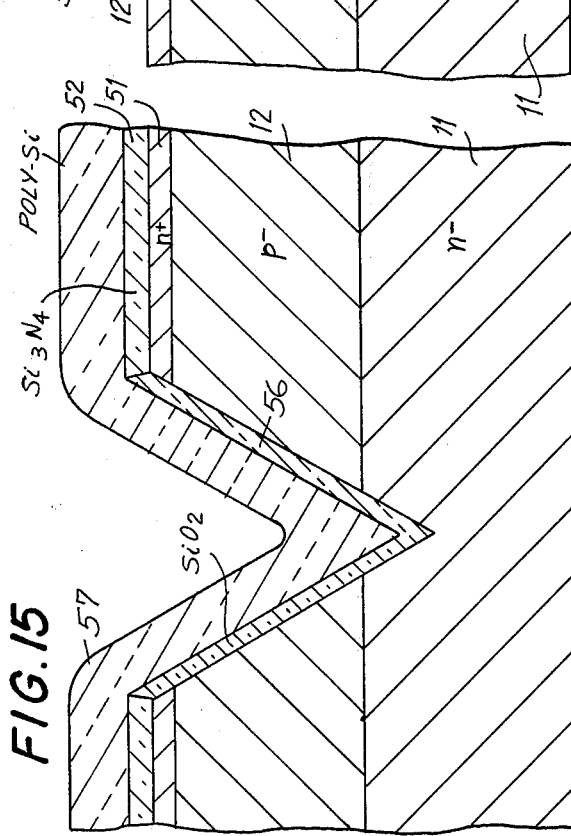
FIG. 15 is a cross-sectional view of the substrate shown in FIG. 14 after a V-groove has been opened therein.

As shown in FIGS. 14 and 15, the next step in the process is to open apertures 55 in the silicon dioxide layer 53 at the precise location that the V-shaped grooves are to be formed. In a manner analogous to that previously discussed with respect to FIGS. 3 and 4, the underlying exposed silicon nitride and other layers are then etched, using any suitable etching process. For example, a standard ethylenediamine pyrocatectol pyrazin solution. The wafer is then thoroughly cleaned.

Next, gate oxide material is grown in the V region, as indicated by reference numeral 56 in FIG. 15. This material, typically $SiO_2$, is then annealed. Next, a layer 57 of poly-silicon is deposited over the entire surface of the wafer to a thickness of from 5,000 to 10,000 Å. Then, phophorous is diffused into the poly-silicon to bring the sheet resistance of the material down to as low a value as possible, ideally in the range of 15 ohm/square. Advantageously, the poly-silicon is firmly oxidized during the diffusion process to a depth of about 3,000 to 5,000 Å.

Figure 16:
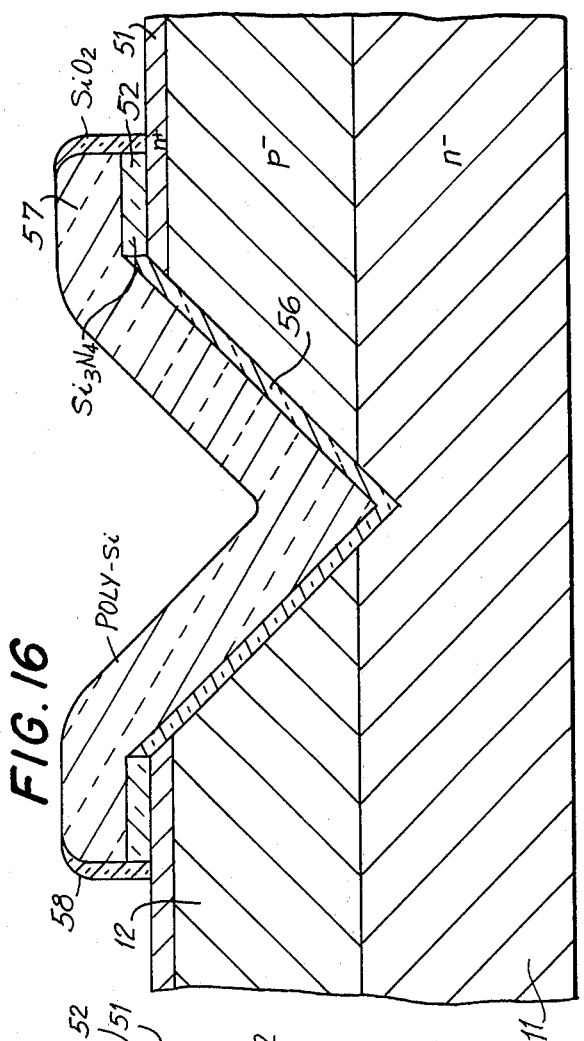
FIG. 16 is a cross-sectional view of the substrate shown in FIG. 15 after the V-groove has been coated with a layer of doped poly-silicon.

Next, a second photo-lithographic step is used to open up the contact regions between the V-grooves. The alignment tolerance for this step is again non-critical, since this opening can occur anywhere within the 5 micron spacing between adjacent V-grooves. Next, the $SiO_2$ layer is etched using, for example, a buffered HF solution, and the poly-silicon is then etched down to the nitride layer using, for example, an EDPP slow-etch process. The photo-resist is then stripped and cleaned and the sidewalls of the exposed poly-silicon firmly reoxidized. Finally, the nitride is etched out of the contact areas to yield the configuration shown in FIG. 16, where reference numeral 58 represents the reoxidized sidewalls of poly-silicon layer 57. Then, a third photo-lithographic step is used to open up the gate bonding pad exposing doped poly-silicon. After this is done, the wafer is metalized with aluminum or a silicon flashed aluminum (1-2%) alloy at a sufficiently high temperature, e.g., 500°-575° C. such that the alloying goes through the thin n+ source diffusion 51 and forms a short circuit between the p− substrate 12 and the n+ source junction layer 51. This is a very critical step, as it is necessary to achieve a sustaining breakdown voltage BVDS of at least 80% of the junction breakdown voltage in the n− to p− junction. Finally, using a fourth and last photo-lithographic step, the top surface of the wafer is coated with aluminum which is then patterned to form the gate bonding pads and the source pads which comprise the remainder of the upper surface of the devices. There is an alternate process which may be used, if desired, to form the gate contacts. In this embodiment, after the poly-silicon is subjected to the phophorous doping step, a 1,000 Å thick layer of silicon nitride is deposited over the entire surface of the wafer. Then, using a second photo-lithographic step, the nitride is removed from the entire surface of the device, except where the gate bonding area is to be. Then, the poly-silicon is etched down to the nitride layer, as in the second embodiment of the invention and the sidewalls thus exposed are reoxidized. Finally, metalization is effected through the source n+ region, as before, and the metal patterns required for the gate bonding pads and source pads are photo-delineated.

A person skilled in the art can make various changes and substitution to the layout of parts shown without departing from the spirit and scope of the invention.

What I claim is:

1. A V-MOS, field-effect, semi-conductor device having gate, source and drain electrodes, which comprises:
    a planar, doped, silicon substrate;
    a first, doped, silicon layer epitaxially grown on said silicon substrate;
    a second, doped silicon layer epitaxially grown on said first silicon layer;
    a plurality of regularly spaced, parallel, first V-grooves extending through said and second and into said first layers;
    a corresponding plurality of regularly spaced, parallel, second V-grooves extending through said second into said first layer, said first and second V-grooves having doped poly-silicon on the walls thereof and being orthogonally oriented with respect to one another and defining by their intersection a plurality of generally rectangular, first regions of the first doped layer which act as body electrodes; and
    a plurality of second regions of said first first doped layer, said second regions acting as additional source regions, each region electrically contacting at least one corner of the four immediately adjacent, an individual device being defined by one source region and portions of the four immediately adjacent additional source regions; (b) the V-groove gate electrode; and (c) the substrate which acts as the drain electrode for the device.

2. A semi-conductor device according to claim 5 wherein said substrate comprises 100 single-crystal silicon, heavily doped n+, said first epitaxial layer comprises lightly doped n− silicon, and said second epitaxial layer comprises lightly doped p− silicon.

3. A semi-conductor device according to claim 1 wherein said substrate comprises 100 single-crystal silicon, heavily doped p+, said first epitaxial layer comprises lightly doped n− silicon, and said second epitaxial layer comprises lightly doped p− silicon.

4. A semi-conductor device according to either claim 2 or claim 3 wherein the regions in said second silicon layer immediately adjacent to the walls of said V-grooves are doped n+ thereby to form source regions adjacent to said grooves.

5. A method of manufacturing a V-MOS, field-effect, semi-conductor device having gate, source, and drain electrodes, which comprises the steps of:
    forming first and second, oppositely-doped, epitaxial layers on a planar, doped, silicon substrate;
    opening along a first direction, at least two, spaced-apart, parallel, first V-grooves in said first and second layers, said grooves extending downwardly but not into said substrate;

opening along a second direction orthogonal to said first direction, at least two, spaced-apart, parallel, second V-grooves extending downwardly but not into said substrate and defining by their intersections at least one, generally rectangular, region of the second doped layer which acts as the body electrode of the device; depositing a layer of poly-silicon on the walls of said grooves; and then, doping said poly-silicon layer thereby to form the gate electrode of said device.

6. The method according to claim 5 wherein said doping step comprises: doping regions in said second epitaxial layer which are immediately adjacent to the walls of said grooves, thereby to form source regions adjacent to said grooves.

7. A method of manufacturing a V-MOS, field-effect, semi-conductor device, having gate, source and drain electrodes, which comprises the steps of:

forming first and second, oppositely-doped, epitaxial layers on a planar, doped, silicon substrate;

opening along first and second orthogonal directions a plurality of spaced-apart, parallel, segmented V-grooves in said first and second epitaxial layers, said V-grooves extending downwardly but not into said substrate, and defining by their intersections a plurality of generally rectangular, first and second regions of the second epitaxial doped layer, which regions act as body electrodes for the device said first regions being formed between said grooves;

depositing a layer of poly-silicon on the walls of said grooves;

doping said poly-silicon layer thereby to form the gate electrodes of said device; and then, said second regions in said second, doped, epitaxial layer, being formed at the intersection of said grooves said regions electrically contacting at least one corner of the four immediately adjacent first regions; an individual device being defined by (a) one electrically-floating source region, and portion of the four immediately adjacent additional regions; (b) the V-groove gate electrode; and (c) the substrate which acts as the drain electrode of the device.

8. The method according to claim 7 wherein said doping step comprises: doping regions in said second epitaxial layer which are immediately adjacent to the walls of said grooves, thereby to form source regions adjacent to said grooves.

9. A V-MOS, field-effect, semi-conductor device having gate, source and drain comprising:

a silicon layer of one conductivity type;

a second silicon layer on a surface thereof and of an opposite conductivity type;

highly doped regions on the surface of said second layer and of said one conductivity type;

at least two spaced apart parallel first semicontinuous V-grooves, extending through said second layer;

at least two spaced apart parallel second semicontinuous V-grooves, extending through said second layer;

said first and second V-grooves having on the walls thereof an insulating layer and an outer conducting layer; said grooves being essentially orthogonally oriented with respect to one another and defining at their intersections, and between the V-grooves, generally rectangular regions of the second layer, which act as the body electrode of the device; said highly doped regions being at the surface of said rectangular areas adjacent said V-grooves and acting as said source; and said conductive layer acting as the gate of the device; and said silicon layer acting as the drain.

10. A semi-conductor device according to claim 9 wherein said silicon layer comprises a substrate which comprises 100, single-crystal silicon, heavily doped n+, and a which first eiptaxial layer which comprises lightly doped n— silicon, and said second layer comprises lightly doped p— silicon.

11. A semi-conductor device according to claim 9, wherein said silicon layer comprises substrate which comprises 100 single-crystal silicon, heavily doped p+, and a first eiptaxial layer which comprises lightly doped p— silicon, and said second layer comprises lightly doped n— silicon.

12. A device according to claim 9, wherein said conducting layer is doped polysilicon.

13. A V-MOS field-effect device comprising a plurality of first parallel semi-continuous V-grooves, and a second plurality of semi-continuous V-grooves, orthogonal with said first grooves, said grooves defining both in the space between said grooves and at the intersection of said grooves where said grooves are discontinuous, a plurality of active FET regions adjacent to the walls of said grooves, the inclusion of said regions at the intersections increases the total active FET area of said MOS device as measured by the ratio of such active FET area to the device area.

14. A device according to claim 13, wherein the width of the groove is narrower than the side of the intersecting active region adjacent said width.

15. A device according to claim 14, wherein said active FET regions between said grooves is substantially rectangular with the corners cut out; and said active FET regions at the intersections is substantially rectangular; said intersection FET region having a rectangular side longer than the width of the adjacent V-groove, and extending adjacent said cut-out corner.

16. A device according to claim 15, wherein the ratio of the groove width to the adjacent intersecting active region rectangular side is more than 60%.

* * * * *